US012571855B2

(12) United States Patent
Jakupi

(10) Patent No.: US 12,571,855 B2
(45) Date of Patent: Mar. 10, 2026

(54) CIRCUIT BREAKERS WITH NOTIFICATION AND REPORTING CAPABILITY

(71) Applicant: Schneider Electric USA, Inc., Andover, MA (US)

(72) Inventor: Andi Jakupi, Marion, IA (US)

(73) Assignee: Schneider Electric USA, Inc., Boston, MA (US)

( * ) Notice: Subject to any disclaimer, the term of this patent is extended or adjusted under 35 U.S.C. 154(b) by 546 days.

(21) Appl. No.: 17/798,975

(22) PCT Filed: Feb. 19, 2021

(86) PCT No.: PCT/US2021/018759
§ 371 (c)(1),
(2) Date: Aug. 11, 2022

(87) PCT Pub. No.: WO2021/168233
PCT Pub. Date: Aug. 26, 2021

(65) Prior Publication Data
US 2023/0063811 A1      Mar. 2, 2023

Related U.S. Application Data

(60) Provisional application No. 62/979,864, filed on Feb. 21, 2020.

(51) Int. Cl.
G01R 31/52 (2020.01)
G01R 31/327 (2006.01)
H02H 3/04 (2006.01)

(52) U.S. Cl.
CPC ......... G01R 31/52 (2020.01); G01R 31/3274 (2013.01); G01R 31/3275 (2013.01); H02H 3/04 (2013.01)

(58) Field of Classification Search
None
See application file for complete search history.

(56) References Cited

U.S. PATENT DOCUMENTS

| 7,095,598 | B2 | 8/2006 | Scott et al. | |
| 8,477,466 | B1 * | 7/2013 | Radosavljevic | ....... H01H 83/04 |
| | | | | 361/42 |

(Continued)

FOREIGN PATENT DOCUMENTS

| CN | 101295609 A | 10/2008 |
| EP | 2360805 A1 | 8/2011 |
| KR | 20190108434 A | 9/2019 |

OTHER PUBLICATIONS

Extended European Search Report issued by the European Patent Office, dated Jul. 29, 2024, in corresponding European Patent Application No. 21757893.9.

(Continued)

*Primary Examiner* — Nasima Monsur
(74) *Attorney, Agent, or Firm* — Kinney & Lange, P.A.

(57)        ABSTRACT

A method of monitoring electrical faults includes processing features of signals output by sensors of a circuit breaker about electrical properties of a circuit coupled with a load and transitioning between states of operation based on the processed features. The states include a normal state, a fault state, and a trip state, wherein the state remains in the normal state until the processed features no longer satisfy normal criteria, after which the state transitions to the fault state, wherein the state transitions back to the normal state when a trip condition is not satisfied, and transitions from the fault state to the trip state when the trip condition is satisfied. The method further includes detecting a warning event when the state transitions from the normal state to the fault state and (Continued)

104 back to the normal state and outputting a warning event notification upon detection of the warning event.

18 Claims, 9 Drawing Sheets

(56)                    References Cited

U.S. PATENT DOCUMENTS

| | | | |
|---|---|---|---|
| 9,659,721 | B1 | 5/2017 | Sastry et al. |
| 2006/0007619 | A1 * | 1/2006 | Scott ...................... H02H 3/382 |
| | | | 361/93.1 |
| 2009/0198459 | A1 * | 8/2009 | Bilac ........................ H02H 3/33 |
| | | | 702/58 |
| 2010/0026425 | A1 | 2/2010 | Roscoe et al. |
| 2010/0149711 | A1 | 6/2010 | Larson et al. |
| 2013/0021163 | A1 | 1/2013 | Watford |
| 2013/0329331 | A1 | 12/2013 | Erger et al. |
| 2014/0139302 | A1 * | 5/2014 | Rubbo ................... H01H 71/40 |
| | | | 335/17 |
| 2016/0225562 | A1 * | 8/2016 | Franks ................... H02H 3/006 |
| 2016/0364975 | A1 | 12/2016 | R. |

OTHER PUBLICATIONS

International Search Report and Written Opinion mailed May 4, 2021 in International Application No. PCT/US21/18759, 16 pages.

* cited by examiner

500

CIRCUIT BREAKERS WITH NOTIFICATION AND REPORTING CAPABILITY

CROSS REFERENCE TO RELATED APPLICATIONS

This application claims priority to U.S. Patent Application Ser. No. 62/979,864 filed Feb. 21, 2020, which is incorporated herein by reference in its entirety.

TECHNICAL FIELD

The present disclosure relates to circuit breakers and more particularly, to circuit breakers with notification capability.

BACKGROUND

A circuit breaker protects an electrical circuit from damage caused by excess current or over voltage, such as from an overload or short circuit. When a fault is detected, the circuit breaker can trip, which interrupts current flow. These trips can be a nuisance. As technology progresses, the sensitivity of circuit breakers can improve, which can also increase the occurrence of nuisance trips.

Advancements in technology used by Arc-Fault Circuit Interruption (AFCI) devices that increase the sensitivity of arc detection may obscure a faulty condition in a load, such as due to wear or aging. For example, newly available hardware can increase the sensitivity of arc detection particularly in the band pass region of 1 MHz up to 40 MHZ. While many appliances found in homes do not generate RF noise in this region, there are exceptions in which real arcing current occurs, such as in motor brushes, high frequency switching of some power supplies, fluorescent lights ignition, etc. These arcing events can have expected patterns that can be filtered. However, changes in patterns, e.g., due to age or wear, may go undetected until the occurrence of a trip.

When a trip does occur, a user may not know whether the trip is merely a nuisance to be ignored, or is an indication of degradation of a load, an outlet, or a cable coupled to a branch monitored by the circuit breaker that tripped. The user may not know whether it is safe to reset the circuit breaker and resume operation. In some cases, operation cannot be resumed due to a condition that caused the trip. Operation is then interrupted until servicing or replacement of a faulty component can be performed. An unexpected interruption of operation of a circuit can be inconvenient, costly, and/or dangerous.

While conventional methods and systems have generally been considered satisfactory for their intended purpose, there is still a need in the art for a circuit breaker that reduces nuisance tripping and provides information before operation is halted that indicates when a load, outlet, or cable is indicating signs of degraded performance. The present disclosure provides a solution.

SUMMARY

The purpose and advantages of the below described illustrated embodiments will be set forth in and apparent from the description that follows. Additional advantages of the illustrated embodiments will be realized and attained by the devices, systems and methods particularly pointed out in the written description and claims hereof, as well as from the appended drawings. To achieve these and other advantages and in accordance with the purpose of the illustrated embodiments, in one aspect, disclosed is a method of monitoring electrical faults. The method includes determining features of signals output by at least one sensor of a circuit breaker, the features representing electrical properties of a circuit coupled with a load. The method further includes transitioning between states of operation based on the processed features. The states of operation include a normal state, a fault state, and a trip state, wherein the state of operation remains in the normal state until the processed features no longer satisfy normal criteria, after which the state of operation transitions to the fault state, wherein the state of operation transitions from the fault state back to the normal state when a trip condition is not satisfied, and transitions to the trip state when the trip condition is satisfied. The method further includes detecting a warning event when the state of operation transitions from the normal state to the fault state and back to the normal state and outputting a warning event notification upon determination of the warning event.

In one or more embodiments, the method can further include buffering the processed features of the signals and outputting contents of the buffer in association with the warning event notification.

In one or more embodiments, the electrical faults can be arc faults, ground faults, and/or grounded neutral faults.

In one or more embodiments, the contents of the buffer can correspond to operation of the circuit breaker from the time it transitions out of normal state until it transitions back to normal state.

In one or more embodiments, the method can further include transitioning to a warning notification state upon dissatisfaction of the normal criteria for buffering the processed features of the signals followed by transitioning to the fault state, transitioning from the fault state to the warning notification state when the trip condition is not satisfied, indicating that the warning event was detected, transitioning from the warning notification state to a communication state for outputting the warning event notification and the contents of the buffer, and transitioning from the warning notification state to the normal state.

In a further aspect of the disclosure, disclosed is a method of monitoring electrical faults. The method includes receiving from a circuit breaker one or more warning event notifications, wherein each warning event notification is based on detection of a pattern of transitions between states of operation of the circuit breaker. The states of operation include a normal state in which the processed features satisfy normal criteria, and a fault state in which the normal criteria are not satisfied, and the pattern includes a series of transitions that includes transitions from the normal state to the fault state and back to the normal state. The method further includes determining a probability of an impending trip based on the one or more warning event notifications and outputting a trip impending notification as a function of the determined probability.

In one or more embodiments, the warning event notification can include a warning duration that indicates a duration of time the circuit breaker did not operate in the normal state, wherein the probability of an impending trip can be determined based upon parameters including at least one of a number of warning event notifications, the warning duration, and a time duration between the warning event notifications, and/or changes in one or more of the parameters.

In one or more embodiments, the method can further include receiving warning data with the warning event notification, the warning data including any of the processed features that are a function of electrical characteristics of an electrical circuit branch connected between the circuit breaker and one or more loads sensed after the breaker transitioned from the normal state. The electrical characteristics can be sensed by the circuit breaker, and the probability of an impending trip can be determined based upon changes in the processed features.

In one or more embodiments, the method can further include disaggregating the warning data to identify which of the one or more loads were powered on or operating when the corresponding electrical characteristics were sensed, wherein the probability of impending trip can be further a function of operation of the one or more loads that were identified.

In one or more embodiments, the method can further include applying at least one model for determining when to output the trip impending notification and applying machine learning, statistical, and/or numerical techniques for training and/or applying the at least one model apply.

In one or more embodiments, the trip impending notification can be output via wireless communication to a user device and/or via a network to a remote device.

In another aspect of the disclosure, disclosed is a circuit breaker coupled to at least one load. The circuit breaker includes a memory configured to store a plurality of programmable instructions and at least one processing device in communication with the memory. The at least one processing device, upon execution of the plurality of programmable instructions is configured to process features of signals output by at least one sensor of the circuit breaker about electrical properties of a circuit coupled with a load and transition between states of operation based on the processed features. The states of operation include a normal state, a fault state, and a trip state. The state of operation remains in the normal state until the processed features no longer satisfy normal criteria, after which the state of operation transitions to the fault state. The state of operation transitions from the fault state back to the normal state when a trip condition is not satisfied, and transitions to the trip state when the trip condition is satisfied. The at least one processing device, upon execution of the plurality of programmable instructions is further configured to detect a warning event when the state of operation transitions from the normal state to the fault state and back to the normal state and output a warning event notification upon detection of the warning event.

In one or more embodiments, the at least one processing device, upon execution of the plurality of programmable instructions can be further be configured to buffer the processed features of the signals and output contents of the buffer in association with the warning event notification.

In one or more embodiments, the contents of the buffer can correspond to operation of the circuit breaker from the time it transitions out of normal state until it transitions back to normal state.

In one or more embodiments, the circuit breaker can include at least one sensor sensing the electrical properties and at least one signal conditioning and conversion unit to condition the signals output by the at least one sensor and convert analog signals of the signals into digital signals. The at least one processing device, upon execution of the plurality of programmable instructions can be further configured to detect and output the processed features of the signals.

In one or more embodiments, the at least one processing device, upon execution of the plurality of programmable instructions can be further be configured to transition to a warning notification state upon dissatisfaction of the normal criteria for buffering the processed features of the signals followed by transitioning to the fault state, transition from the fault state to the warning notification state when the trip condition is not satisfied, indicating that the warning event was detected, transition from the warning notification state to a communication state for outputting the warning event notification and the contents of the buffer, and transition from the warning notification state to the normal state.

In still another aspect of the disclosure, disclosed is an edge device for monitoring electrical faults. The edge device includes a memory configured to store a plurality of programmable instructions and at least one processing device in communication with the memory, wherein the at least one processing device, upon execution of the plurality of programmable instructions is configured to receive from a circuit breaker one or more warning event notifications, wherein each warning event notification is based on detection of a pattern of transitions between states of operation of the circuit breaker. The states of operation include a normal state in which processed features of signals sensed by the circuit breaker satisfy normal criteria, and a fault state in which the normal criteria are not satisfied, and the pattern includes a series of transitions that includes transitions from the normal state to the fault state and back to the normal state. The at least one processing device, upon execution of the plurality of programmable instructions is configured to determine a probability of an impending trip based on the one or more warning notifications and output a trip impending notification as a function of the determined probability.

In one or more embodiments, the warning event notification can include a warning duration that indicates a duration of time the circuit breaker did not operate in the normal state, wherein the probability of an impending trip can be determined based upon parameters including at least one of a number of warning event notifications, the warning duration, and a time duration between the warning event notifications, and/or changes in one or more of the parameters.

In one or more embodiments, the at least one processing device, upon execution of the plurality of programmable instructions can be further configured to receive warning data with the warning event notification, wherein the warning data can include any of the processed features that are a function of electrical characteristics of an electrical circuit branch connected between the circuit breaker and one or more loads sensed after the breaker transitioned from the normal state. The electrical characteristics can be sensed by the circuit breaker, and the probability of an impending trip can be determined based upon changes in the processed features.

In one or more embodiments, the at least one processing device, upon execution of the plurality of programmable instructions can be further configured to disaggregate the warning data to identify which of the one or more loads were powered on or operating when the corresponding electrical characteristics were sensed, wherein the probability of impending trip can further a function of operation of the one or more loads that were identified.

In one or more embodiments, the at least one processing device, upon execution of the plurality of programmable instructions can be further configured to apply at least one model for determining when to output the trip impending notification and/or apply machine learning, statistical, and/or numerical techniques for training and/or applying the at least one model apply.

In one or more embodiments, the trip impending notification can be output via a wireless communication to a user device and/or via a network to a remote device.

In an additional aspect of the disclosure, disclosed is a non-transitory computer readable storage medium having one or more computer programs embedded therein, which when executed by a computer system, cause the computer system to receive from a circuit breaker one or more warning event notifications, wherein each warning event notification is based on detection of a pattern of transitions between states of operation of the circuit breaker. The states of operation include a normal state in which the processed features satisfy normal criteria, and a fault state in which the normal criteria are not satisfied, and the pattern includes a series of transitions that includes transitions from the normal state to the fault state and back to the normal state. The non-transitory computer readable storage medium, when executed by the computer system, further causes the computer system to determine a probability of an impending trip based on the one or more warning event notifications and output a trip impending notification as a function of the determined probability.

In an additional aspect of the disclosure, disclosed is a non-transitory computer readable storage medium having one or more computer programs embedded therein, which when executed by a computer system, cause the computer system to process features of signals output by at least one sensor of the circuit breaker about electrical properties of a circuit coupled with a load and transition between states of operation based on the processed features. The states of operation include a normal state, a fault state, and a trip state. The state of operation remains in the normal state until the processed features no longer satisfy normal criteria, after which the state of operation transitions to the fault state. The state of operation transitions from the fault state back to the normal state when a trip condition is not satisfied, and transitions to the trip state when the trip condition is satisfied. The non-transitory computer readable storage medium, when executed by the computer system, further causes the computer system to detect a warning event when the state of operation transitions from the normal state to the fault state and back to the normal state and output a warning event notification upon detection of the warning event.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

Identical reference numerals have been used, where possible, to designate identical elements that are common to the figures. However, elements disclosed in one embodiment may be beneficially utilized on other embodiments without specific recitation.

DETAILED DESCRIPTION

Figure 1:
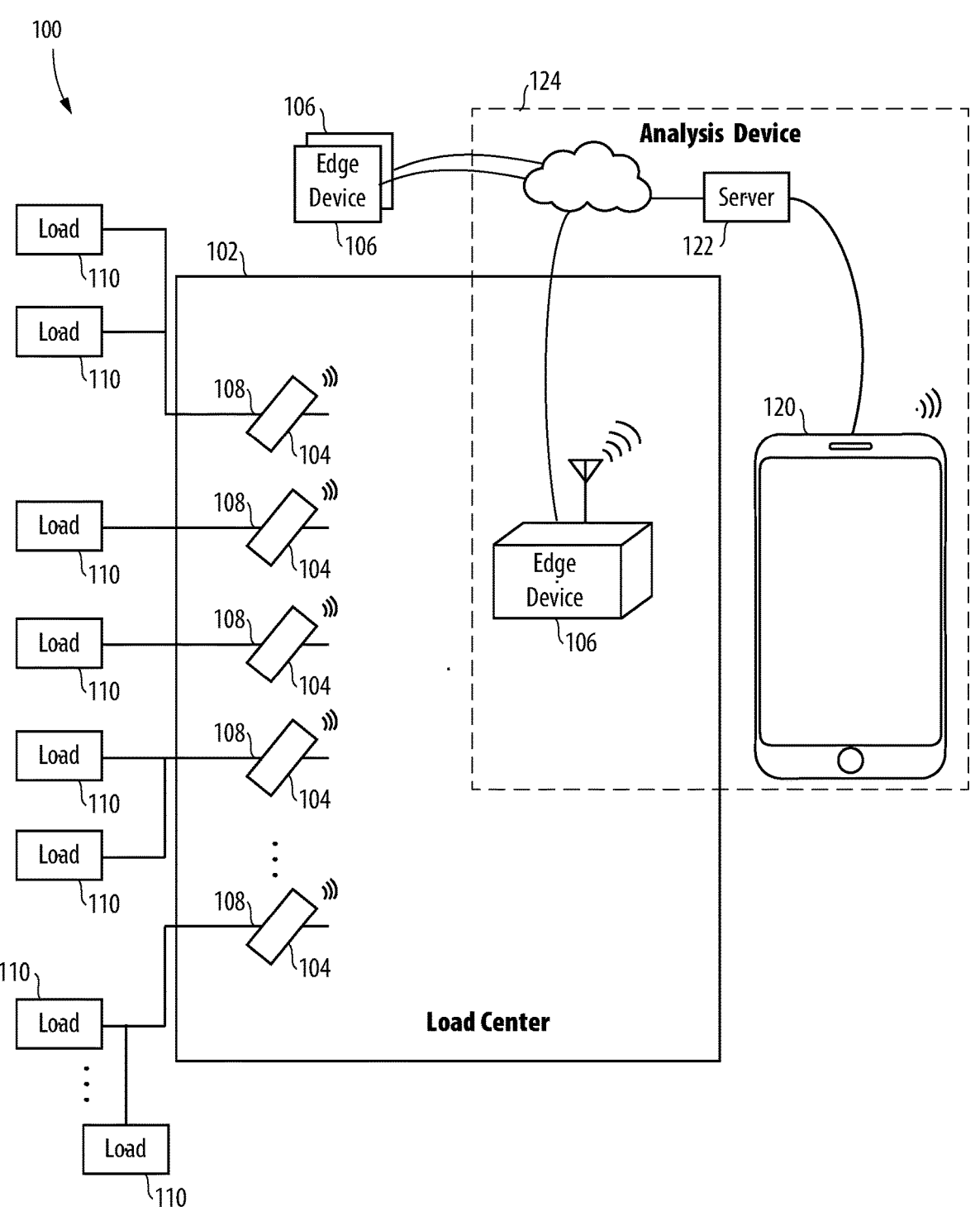
FIG. 1 is a block diagram illustrating an example circuit management system, in accordance with embodiments of the disclosure.

Reference will now be made to the drawings wherein like reference numerals identify similar structural features or aspects of the subject disclosure. For purposes of explanation and illustration, and not limitation, a schematic diagram of an exemplary embodiment of circuit management system in accordance with the disclosure is shown in FIG. 1 and is designated generally by reference character 100. Other embodiments of a circuit management system in accordance with the disclosure, or aspects thereof, are provided in FIGS. 2-6, as will be described.

Circuit management system 100 includes a load center 102 that includes one or more circuit breakers 104. Circuit breakers 104 are configured to communicate with an edge device 106. The communication between circuit breakers 104 and edge device 106 can have a fixed bandwidth. Each circuit breaker 104 is coupled to an electrical circuit, referred to as branch 108, which includes interfaces to one or more loads 110, e.g., appliances, motors, etc. Each circuit breaker 104 senses electrical characteristics of its corresponding branch 108 and can be configured to detect conditions associated with branch 108 that can lead up to unwanted trips (referred to as nuisance trips) in which a switch of the circuit breaker 104 is controlled to interrupt current flow, and provide warnings to edge device 106. Edge device 106 receives and further processes data from circuit breakers 104, including, for example, warnings of potential nuisance trips. Edge device 106 can communicate with an external user device 120 (such as a mobile computing device, desktop computer, server, etc.,) and/or a cloud-based server 122, such as to provide the received data and results of processing the received data.

Communication between circuit breakers 104 and edge device 106 and communication between edge device 106 and user-device can use wireless communication, such as near-field communication or WiFi communication (e.g., using protocols such as ZigBee™, Bluetooth™ low Energy (BLE), Bluetooth™ (BL) 4.0, WiFi, etc., without limitation). It is also understood that communication between edge device 106 and user device 106 and/or server 122 can include wired and optionally wireless communication via a network, such as local area network (LAN) or a wide area network (WAN), such as the Internet.

Circuit breakers 104, edge device 106, user device 120, and server 122 include a processing device operatively connected to, and/or integrated with, a memory and a communication interface for communicating with other components of circuit monitoring system 100, as described. The processing device can include, for example a microcontroller, microprocessor, programmable logic device (PLD), digital signal processors (DSP), a microcontroller, field programmable gate arrays (FPGA), an application specific integrated circuit (ASIC), and/or other discrete or integrated logic circuitry having similar processing capabilities. In one or more embodiments, circuit breakers 104 and/or edge device 106 can be configured, respectively, as an embedded device.

Nuisance trips can occur due to arc faults, ground faults, or grounded neutral faults. An arc fault can be caused, for example, when a load is wearing out and no longer performing in accordance with its specification, the load emits high frequency (HF) noise due to sustaining internal damage or due to poor design, connections on wire nuts and/or splices are intermittent, damage or pinching of cables, and/or connection on outlets and/or switches are loose. A ground fault can be caused, for example, when there is current leakage from a load 110, there are fast transients and/or spikes in current or voltage that cause high frequency current leakage of the associated branch 108, and/or slow wearing out of the load 110 and/or damage to isolation of associated cables. A grounded neutral fault is when miswiring between neutral and ground, shared neutral wiring, etc. This is usually detected prior any load is powered and assists the electricians to check the wiring by issuing a trip. However, there are some loads that generate signals that interferes with the operation of the ground fault detection in the circuit breaker and the correct impedance between the neutral and ground is not measured correctly, therefore causing a nuisance trip.

Conventional circuit breakers that have Arc-Fault Circuit Interruption (AFCI) and/or Ground-Fault Circuit Interruption (GFCI) circuits can trip due to nuisance tripping, but are not configured to collect information about the cause of the nuisance trip or to provide information supplemental to the nuisance trip. Users and manufacturers lack information about how loads age and/or wear out. Newer circuit breakers can have increased sensitivity for detecting electrical faults, potentially increasing the occurrence of nuisance trips. However, a nuisance trip without information about the cause of the nuisance trip is not helpful.

On the contrary, in accordance with the present disclosure, each circuit breaker 104 is provided with a state machine and an electrical fault algorithm that creates warning events when the state machine transitions from a normal state to a fault (arc, ground fault, or grounded neutral fault) state and returns to a normal state. In addition, circuit breaker 104 stores queued data about low frequency (LF) and high frequency features extracted from electrical characteristics sensed by circuit breaker 104. Each time a warning event is detected, notification of the warning event is provided to edge device 106 with HF and LF feature data (also referred to as warning data) that includes the queued data associated with the warning event. Since circuit breaker 104 has transitioned back to normal state, circuit breaker 104 continues to operate and queue data. If another warning event occurs, edge device 106 receives an associated warning event notification with updated associated warning data.

Edge device 106 can provide all or selected data received from circuit breakers 104 (e.g., metering data, warning data, and warning event notifications) to server 122. In one or more embodiments, edge device 106 can merely function as a conduit between circuit breakers 104 by transferring data between circuit breakers 104 and server 122. In one or more embodiments, any of analysis devices 124, including edge device 106, user device 120, and server 122 can receive and process the data output by circuit breakers 104 and/or exchange results of the processing.

Any of analysis devices 124 (also referred to individually or collectively as analysis device 124) can process and/or store (using associated storage devices) the data output from circuit breakers 104. Storage can be provided by storage devices accessible to the analysis device 124. Analysis device 124 can process the circuit breakers' output data by disaggregating the warning data using any known techniques or techniques not yet discovered, e.g., according to a load identified as being associated with a particular circuit breaker 104, and pairing the disaggregated warning data with the load identified.

Analysis device 124 can further build a statistical model based on the warning data as well as other parameters, such as frequency of occurrence of the warning events, duration of the warning events (usually in half-cycles, e.g., measured as the duration of fault state without causing a trip (e.g., start of transition from normal state to fault state and the transition back to normal state)). In this way, circuit breakers 104 having sensitive arc fault and/or ground fault detection hardware can apply the electrical fault detection algorithm to provide multiple instances of queued data to edge device 106. Analysis device 124 can use the warning data to create historical data for deducing or predicting, for example, load wear or ageing conditions and/or future trips.

Such predictions can utilize a probabilistic learning approach. The probabilistic can include multiple dimensions of a collected information space. The information space is based on any combinations of the HF and LF features, but is not limited to duration of the warning, frequency of the warning, etc.

In one or more embodiments, analysis device 124 can generate a model for a load. Analysis device 124 can determine a time line of operation of the load. The time line can be implemented to determine time of use and frequency of warning events, for example based on operation of the load over time without triggering any warning events. Once a circuit breaker 104 triggers one or more warning events, analysis device 124 can determine, and update over time, a probability of a warning event, based on operation of the load and the occurrence of further warning events. Initially probability can be low, increasing with the frequency of warning events in association with operation of the load. For example, the probability of an impending trip may increase incrementally when there is an isolated occurrence of a warning event or occasional occurrences that are sufficiently spaced out over time. However, the probability of an impending trip can increase due to certain conditions, such as an increase in the frequency of warning events, a decrease of the number of instances of normal operation between warning events, or warning events occur consecutively a threshold number of times, this can increase. The illustrated conditions are meant as examples only, and not as an exhaustive list of conditions.

Once probability of warning events reaches a threshold probability (e.g., 50% or 75% probability, without limitation to a particular threshold probability), analysis device 124 can output an impending trip notification to a user (e.g., via user device 120) and/or a third party (e.g., manufacturer of the load, service company for servicing the load, appliance rating organization, etc.) that a future trip might occur. Notification to the manufacturer can include warning data and provide information to the manufacturer about life time or servicing requirements of the product. The manufacturer can pass this information on to the user for more effective use of the appliance, and/or the appliance rating organization can utilize this information to rate appliances to aid consumers select appliances to purchase. For example, the manufacturer can automate exchange of recall information with customers based on receipt of an impending trip notification or warning data.

Analysis device 124 can perform further analysis of the warning data to provide more insights. For example, when a particular load always triggers a warning event from a circuit breaker 104, analysis device 124 can track parameters, such as duration of warning events or values included in the associated warning data, to determine if the parameter is increasing over time. As duration of warning events increases, there is a likelihood that the duration will eventually reach a predetermined trip time limit, causing the circuit breaker 104 to trip. A warning event duration threshold can be implemented, such that once the warning event duration reaches the warning event duration threshold an impending trip notification is sent to the user or third party.

In one or more embodiments, analysis device 124 can generate a second model based on values of warning data received from a circuit breaker 104 in association with one or more warning events that correspond to a particular load. For example, changes in radio frequency (RF) energy and/or low frequency current measurements change relative to warning data associated with previous warning events can indicate stability deviation relative to previous operations of the load. This can be an indication that the load is wearing out and is likely to eventually undergo abnormal operation that can trip circuit breaker 104.

In one or more embodiments, analysis device 124 can use multiple models for a load and/or implement machine learning techniques for facilitating model building scenarios. K-nearest neighbors (KNN) prediction algorithm based on feature sets and feature region spaces created based on a similarity measures, can be used as a way to identify a future impending trip. Also Naïve Bayes models can be utilized in other embodiments where feature data clustering and metadata allows estimation of a classification for triggering an impending trip notification to the user that an impending trip will occur. Analysis device 124 can thus learn about operation of the various loads coupled to a load center 102 based on associated warning events and create a statistical and/or numerical model, for example, for each load. For example, mean time between warning events and frequency of occurrence of warning events relative to operation of the load can be used and/or modeled for sending notification of an impending trip to the user.

Further, in one or more embodiments, analysis device 124 can participate in crowd sourcing, in which multiple edge devices 106 report warning events and provide associated warning data to a server 122 for updating and/or train the model(s) per load over time. The model(s) can set criteria to trigger a notification of an impending trip.

When edge device is not an analysis device 124 that determines impending trips, edge device 106 can respond to the external diagnostic request with diagnostics-mode information output by the circuit breaker when operating in diagnostics mode. The user device 120 or server 122 can operate as an analysis device 124 to determine an impending trip and output an impending trip notification. When edge device is an analysis device 124 that determines impending trips, edge device 106 can respond to an external diagnostic request with trip history information that includes impending trip notifications and associated time stamps.

Thus, the user device 120 or server 122 can receive notification of or determine that there is a likelihood of an impending trip. This can provide an early warning to a user or a third party that a potential trip is likely to occur in association with a particular load or clarify that a nuisance trip is an indicator of an impending real (wanted) trip. The notification of impending trip can provide information to the user and/or a third-party for taking action (e.g., repair or replacement of the load). Early action can avert failure of a load 110 at an inconvenient time, such failure of a washing machine while full with water or failure of an oven on the day of a holiday dinner.

An example potential advantage of circuit monitoring system 100 can be demonstrated in view of conventional circuit breakers that are equipped with enhanced arc fault detection components are sensitivity mostly to RF (Radio Frequency) signals in the band pass region of 1 MHz up to 40 MHZ. Many loads found in homes do not generate RF noise in this band pass region, with the exception of some loads where there is real arcing current in motor brushes, or high frequency switching of some power supplies, e.g., fluorescent lights ignition, etc. When these loads operate, sensed RF signals may exhibit certain expected repetitive patterns, which the enhanced arc fault detection component can filter out. However, when these RF signals start changing and their repetitive patterns change, a conventional circuit breaker equipped with enhanced arc fault detection can experience a potential non-hazard arc-fault in which the state of the circuit breaker's detection state machine will transition from normal state to fault state and back to a normal state, unbeknownst to the user.

On the contrary, when enhanced arc detection is used by a circuit breaker 104 in circuit monitoring system 100, the non-hazard arc-fault triggers a warning event. The analysis device 124 tracks the warning events and can detect the change in pattern. Analysis device 124 can apply one or more models to determine whether the change in pattern is an indication of an impending trip, and notify the user accordingly. The models can be enhanced by server 122 collecting data from multiple edge devices 106 using various techniques, such as machine learning, statistical, and/or numerical techniques.

Figure 2:
FIG. 2 is an example flow diagram of a circuit breaker of the circuit management system of FIG. 1, in accordance with embodiments of the disclosure.
Figure 2:
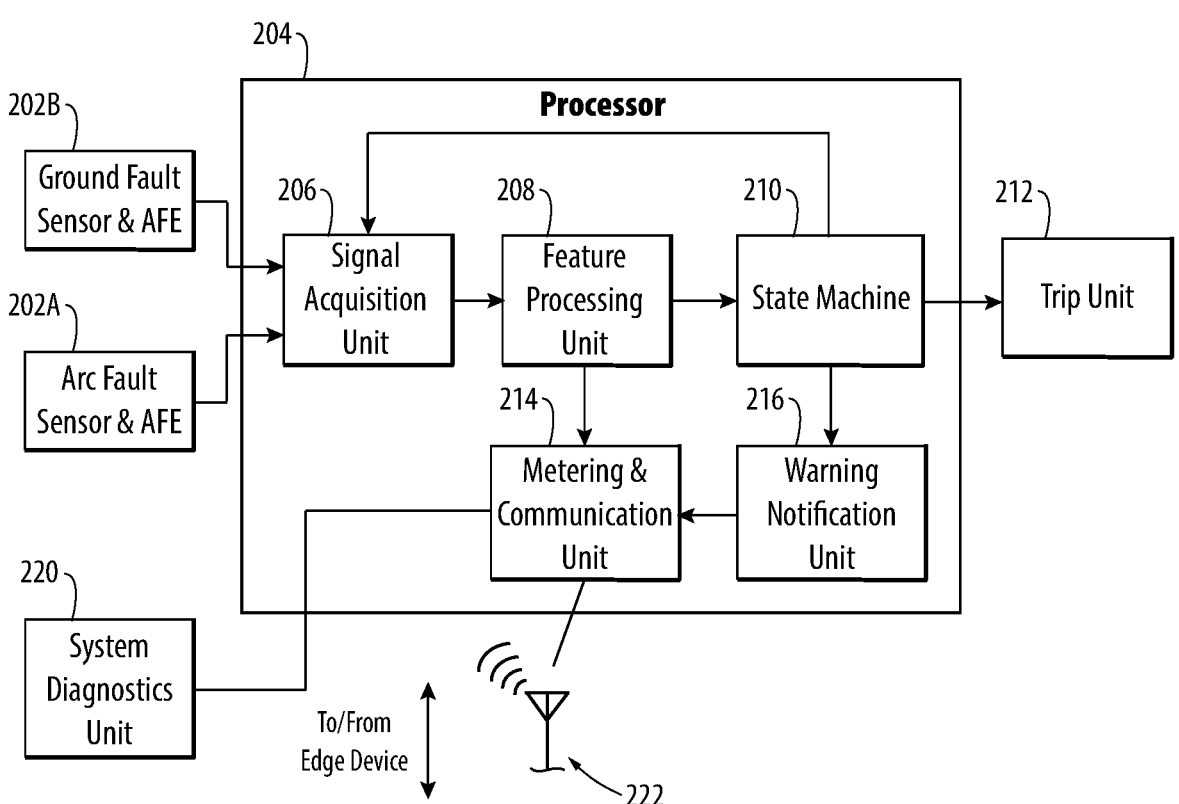

With reference to FIG. 2, and continued reference to FIG. 1, a block diagram of an example configuration of circuit breaker 104 is shown. Circuit breaker 104 includes arc fault sensor(s) and analog front-end (AFE) 202A, ground fault sensor(s) and AFE 202B, processor 204, trip unit 212, and optionally a self-test device 220. Processor 204 is shown to include signal acquisition unit 206, feature processing unit 208, state machine 210, metering and communication unit 214, and warning notifications unit 216.

Processor 204 can include one or more processing devices and can be implemented in hardware, software, and/or firmware, such as any of a microcontroller, microprocessor, ASIC, PLD, FPGA. In one or more embodiments, any of signal acquisition unit 206, feature processing unit 208, state machine 210, metering and communication unit 214, and warning notifications unit 216 can be external to and accessible to processor 204. One or more of the other components of circuit breaker 104, or a portion of the components, can be integrated with processor 204.

Sensors of arc fault sensor(s) and AFE Sensors 202A and ground fault sensor(s) and AFE 202B sense physical characteristics and output analog voltage or current signals. Examples of physical characteristics include real-time signals and related electrical characteristics of the branch 108 to which circuit breaker 104 is coupled. The sensors can sense, for example, line current, line voltage, RF signals, a received signal strength indicator (RSSI) for sensed signals, and differential current, without limitation to these particular electrical characteristics. The sensors can be configured to monitor for one or more of arc-faults, ground faults, grounded neutrals, power consumption, etc.

AFE circuits of arc fault sensor(s) and AFE 202A and ground fault sensor(s) and AFE 202B include a set of analog signal conditioning circuitry for conditioning sensed signals to interface with other components of circuit breaker 104, such as an antenna, analog-to-digital (A/D) converter, microcontroller, etc.

Signal acquisition unit 206 includes an A/D converter configured to continuously convert analog sensor signals from arc fault sensor(s) and AFE 202A and ground fault sensor(s) and AFE 202B to digital sensor signals having a level that corresponds to the analog voltage or current signals sensed by arc fault sensor(s) and AFE 202A and ground fault sensor(s) and AFE 202B, such as for each half-cycle signals along the corresponding branch 108, e.g., signals having a 50 Hz or 60 Hz network frequency.

Feature processing unit 208 is configured to receive and process the digital sensor signals and compute and output feature data of features determined from the digital sensor signals, e.g., using signal processing techniques. The features represent electrical properties of the circuit coupling the circuit breaker 104 with load(s) 110. Feature data include, for example values for peak current (Ipeak), root mean square (RMS) current (Irms), peak voltage (Vpeak), RSSI transitions, RSSI Signal-to-Noise Ratio (SNR), current phase (Iphase), RSSI energy, etc. Feature processing unit 208 outputs metering data (meaning power and energy measurements) to communication unit 214 independently of state machine 210.

State machine 210 (SM) applies a fault detection algorithm that detects faults (arc (in series or in parallel with load), ground, and grounded neutral faults) in the associated branch 108 that can be used to trigger a trip (e.g., control the switch that interrupts current flow). Hazardous arc faults and ground faults can be detected based on the profile of certain arc-fault half-cycles or ground fault half-cycles, as described in standards, such as Underwriters Laboratories (UL) and International Electrotechnical Commission (IEC). However, there are non-hazardous arcing or ground fault half-cycles that are not hazardous. For example, some arcing half-cycles are caused by fast transients of load switching or normal operation of the load or occur for a very short amount of time and do not result into potential ignition of fire.

Trip unit 212 includes components for opening a circuit of circuit breaker 104, such as a solenoid, a pneumatic element, or the equivalent.

Metering and communication unit 214 obtains information collected by warning notifications unit 216, as stored in one or more queues, and creates packets for transmission via antenna 222 to edge device 106 [, or a wired connection]. When a trip or notification of impending trip is triggered, metering and communication unit 214 outputs packets with messages about the triggered trip or notification of impending trip and further outputs packets with warning data that includes information collected by warning notifications unit 216. Metering and communication unit 214 further outputs metering data. Metering data can include basic data, such as integration of power over 1 second, RMS voltage, RMS current, etc. Metering data is sent for at a relatively low rate, such as 0.5 Hz or 1 Hz. The rate at which metering data is transmitted can be configured to enable all of the circuit breakers 104 to transmit metered data to edge device 106 when operating in normal mode.

Warning notifications unit 216 collects feature data output by the feature processing unit 208. For example, the HF and LF feature data can be queued in an HF and LF queue and ready to be output when state machine 210 transitions from fault state to normal state. The HF and LF queue stores feature data for high frequency and low frequency signals. Warning notifications unit 216 further sends an internal warning event notification to metering and communication unit 214 when a warning event is triggered and HF and LF feature data from the HF and LF queue is output to edge computing device 106. If included, system diagnostics unit 220 is configured to perform diagnostics, e.g., self-tests, on internal circuits of circuit breaker 204. For example, system diagnostics unit 220 can perform diagnostics on arc fault sensor(s) and AFE 202A and ground fault sensor(s) and AFE 202B, a microcontroller (MCU) of processor 204, internal communication channels, position of a switch of the circuit breaker, integrity of the firmware and memory, etc.

Figure 3:
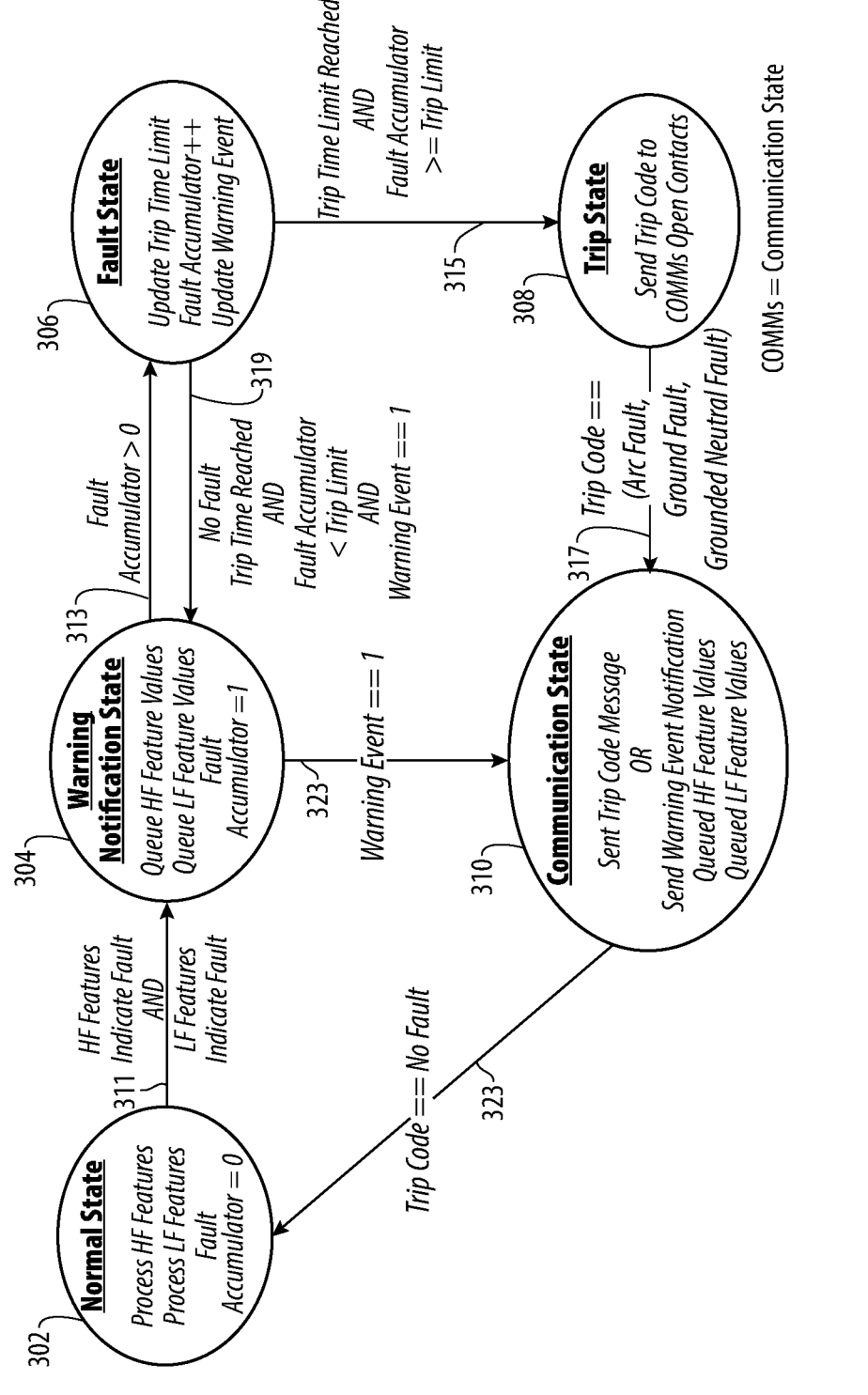
FIG. 3 is an example state machine diagram of a state machine of the circuit breaker shown in FIG. 2, in accordance with embodiments of the disclosure.

With reference to FIG. 3, and continued reference to FIGS. 1 and 2, an example diagram of state machine 210 is shown. State machine 210 can be implemented using software, hardware, and/or firmware. State machine 210 is configured to transition between a plurality of states, the states including a normal state 302, a warning notification state 304, a fault state 306, a trip state 308, and a communication state 310. The fault state indicates detection of any potential hazardous fault (e.g., arc fault, ground fault or grounded neutral fault in order to protect the circuit, user, or customer.

Operation begins in normal state 302 during which feature data output by feature processing unit 208 are processed and a fault accumulator variable (Fault Accumulator) is set to the value 0. The feature data can include HF feature data that correspond to extracted HF features and LF feature data that correspond to extracted LF features. In the example provided, high frequency is above 1 MHZ and low frequency is between 10 Hz-10 KHz. Operation continues in normal state 302 while the HF and LF feature data satisfy normal criteria, such as the absence of detection of a fault half-cycle. For example, an arc-fault is determined when both the HF feature data and LF feature data indicate arc-fault half-cycles as defined in UL1699 standard. A ground-fault is determined when the differential current (leakage current) reaches levels as defined by the UL493 standard. A grounded neutral fault is determined when impedance between ground and a neutral is shorted or close to 0 ohms at the load side.

During normal operation, circuit breaker 104 continues to operate as shown in FIG. 2, including acquiring, processing and packetizing sensed data, and outputting the packetized data as metering data. The metering data which can include, for example data for monitoring power and energy consumption, is output via the communication unit. Operation remains in normal state 302 until it transitions to warning state 304.

Also, when operating in normal state 302, the HF and LF queue is emptied. In normal state, state machine 210 does not output data to metering and communication unit 214 (although metering data can be output to communication unit 214 by feature processing unit 208).

Once normal criteria are no longer satisfied, such as due to detection of a fault half-cycle, operation transitions out of normal state, and transitions eventually to fault state 306. In fault state 306 monitoring is performed for trip conditions. When a trip condition is satisfied, operation transitions to trip state 308. When the trip condition is not satisfied, such as within a time constraint, operation transitions back to normal state 302.

In the example shown in FIG. 3, once normal criteria are no longer satisfied, the state of operation transitions from normal state 302 to warning notification state 304, as indicated by arrow 311. In warning notification state 304, storage of the HF and LF feature data in the HF and LF queue is commenced. In addition, Fault Accumulator is set to the value one. Once Fault Accumulator is greater than zero, operation transitions to the fault state 306, as indicated by arrow 313. The state may loop between warning notification state 304 and fault state 306 until Warning Event is equal to one, due to an update of Warning Event in fault state 306. When Warning Event is equal to one, the state of operation transitions to communication state 310. In fault state 306 monitoring is performed for the trip condition.

A trip time variable (Trip Time Limit) is determined based on trip time criteria defined in the arc-fault and/or ground fault standards. Trip Time Limit determines the duration of time the state machine 210 can be in fault state 306 before transitioning to trip state 308, causing a switch of circuit breaker 104 to open one or more contacts in order to interrupt the flow of current. Trip Time Limit is usually determined by units of half-cycles or milliseconds (ms) based on the definition of the corresponding fault described in the UL1699 or UL493 standards and the load rated current or leakage current. Fault Accumulator is incremented for every half-cycle the LF and HF feature data indicate a fault. A fault timer variable (Fault Timer) is started, which counts half-cycles while in fault state 306. In this way, fault state 306 can be exited if the value of Trip Limit does not reach the value of Fault Accumulator. State machine 210 tracks Fault Timer with respect to Trip Time Limit, and further tracks Fault Accumulator with respect to Trip Time Limit. Since Fault Accumulator may not be incremented at every half-cycle, the value of Fault Accumulator may remain lower than the value of Trip Limit, causing the state of operation to transition from fault state 306 to warning state 304 and possibly eventually normal state 302.

Fault Accumulator is incremented each time a fault half cycle is detected. When Fault Accumulator reaches Trip Time Limit and Fault Time equals Trip Time Limit, the trip condition is met and the state of state machine 210 transitions to trip state 308, as shown by arrow 315.

Since Fault Accumulator may not be incremented at every half-cycle, the value of Fault Accumulator may remain lower than the value of Trip Limit. If Fault Accumulator does not reach Trip Time Limit, the trip condition is not satisfied, and the state of state machine 210 transitions back to warning notification state 304, as shown by arrow 317, and then to normal state 302. When the state of state machine 210 transitions back to warning notification state 304, a warning event variable (Warning Event) is set to one and all the HF and LF feature data in the HF and LF queue is output to the communication state 310. It is noted that Warning Event is not set to one when state of state machine 210 transitions from fault state 306 to trip state 308.

However, if Trip Time has reached the predetermined trip time limit and Fault Accumulator is less than Trip Time, Warning Event is set to one, indicating that a fault did not occur within the require trip time defined by the corresponding standard, or the fault was not sufficiently severe enough to cause any hazard to the circuit or the user. Since the trip criteria was not satisfied, operation returns to warning notification state 304, as indicated by arrow 319. Once Warning Event is set to one, the state of state machine 210 transitions back to warning notification state 304, communication state 310, and then normal state 302.

In trip state 308, Trip Code identifies the type of fault that was detected is output to the next state (communication state

310) and a switch that is operated to open contacts and interrupt the flow of current. In addition, operation flows to communication state 310.

At communication state 310, a determination is made whether Trip Code indicates a fault, such as an arc fault, ground fault, or ground neutral fault. If any of these faults are indicated, operation does not return to normal state, and operation of the circuit breaker 102 ends.

If operation returned from fault state 306 to warning notification state 304 via arrow 319, Warning Event is set to one. At warning notification state 304, if Warning Event is equal to one, operation transitions to communication state 310, as indicated by arrow 321 and queued LF and HF featured data are output.

In communication state 310, if Warning Event is equal to 1 (as would be true if it was determined that there was not any fault, but there was a warning event), then a warning event notification is output with contents of the HF and LF queues. Furthermore, when Warning Event is equal to one, this indicates that there was no occurrence of a fault. Accordingly, when the determination that Warning Event is equal to one, indicating there is no occurrence of a fault, operation returns to normal state 302, as indicated by arrow 323.

In this way, each time state machine 210 transitions from normal state 302 to fault state 306 (via warning notification state 304) and back to normal state 302 (via communication state 310), a warning event has occurred, resulting in output of a warning event notification to edge device 106. The contents of the HF and LF queue are also output to edge device 106 in association with each warning event notification. The HF and LF features included in the HF and LF queue can provide information indicative of a source of the reason for the warning event, be disaggregated per load, and/or monitored for determination of an impending trip or need for service or removal of a load, outlet, or cable.

It is noted that HF and LF data are only provided to communication state 310 when a warning event is detected, since the HF and LF data require higher bandwidth than the metering data. When state machine 210 transitions to fault state and consequently to a trip state, a trip code variable (Trip Code) is sent to the communication state, as shown by arrow 317, and the circuit is interrupted.

Edge device 106 is able to disaggregate the metering data to determine loads that are running at any time and to associate a received warning event notification or an impending trip notification to be output to a specific circuit breaker 104 and/or to a specific load. When edge device 106 receives a warning event notification, it can provide metadata that identifies a specific circuit breaker 104 and/or load 110 associated with the warning event notification or impending trip notification. The metadata identifies the circuit breaker 104 and/or load 110 associated with each warning event notification and impending trip notification. In one or more embodiments, the metadata can include additional information, such as name and/or model of the load 110 identified, (such as Kenmore™ vacuum cleaner or General Electric™ washer, model #GTW465ASNWW). In addition, HF and LF feature data associated with the warning event notification and/or impending trip notification is analyzed. The analysis can include using the metadata and associated HF and LF feature data to build and/or be compared to a statistical model based on HF and LF feature data associated with the warning event notification. Results of the comparison can be used to take an action, such as to send an impending trip notification or a message recommending replacement or servicing.

In one or more embodiments, user device 108 can submit a monitor request to edge device 106. In one or more embodiments, the monitor request identifies a particular one or more circuit breakers 104 for which metering data is requested. In one or more embodiments, the monitor request can identify one or more, or all circuit breakers 104 from which the user device 108 selects to receive metering data and/or metadata. In one or more embodiments, the monitor request can identify one or more, or all loads 110 for which the user device 108 selects to receive metering data and/or metadata. In one or more embodiments, edge device 106 can aggregate the metering data and/or metadata for only the circuit breaker(s) 104 or load(s) 110 identified by the monitor request. In addition, in one or more embodiments, edge device 106 can send only the metering data or metadata requested for the circuit breaker(s) 104 or load(s) 110 identified by the user.

A load can be identified in the monitor request, for example, by brand name, load name, type, and/or model, e.g., Kenmore™ vacuum cleaner or General Electric™ humidifier, etc.). Edge device 106 can respond to the monitor request by providing user device 108 with, for example, a list of each load that is operating at the time the monitor request is received. In one or more embodiments, the list can identify the circuit breaker 104 to which each identified load is connected. A user of user device 108 can select one or more loads from the list and send an updated monitor request that identifies the selected one or more loads. In response, edge device 106 can send metering data and/or metadata for the identified loads.

FIGS. 4 and 5A-5D show an exemplary and non-limiting flowcharts illustrating a method for generating software applications, in accordance with certain illustrated embodiments. Before turning to the description of FIGS. 4 and 5A-5D, it is noted that the flowcharts in FIGS. 4 and 5A-5D shows examples in which operational blocks are carried out in a particular order, as indicated by lines showing the flow between the operational blocks, but the various blocks shown in this process flowchart can be performed in a different order, or in a different combination or sub-combination. It should be appreciated that in some embodiments some of the blocks described below may be combined into a single block. In some embodiments, one or more additional blocks may be included. In some embodiments, one or more of the blocks can be omitted.

Figure 4:
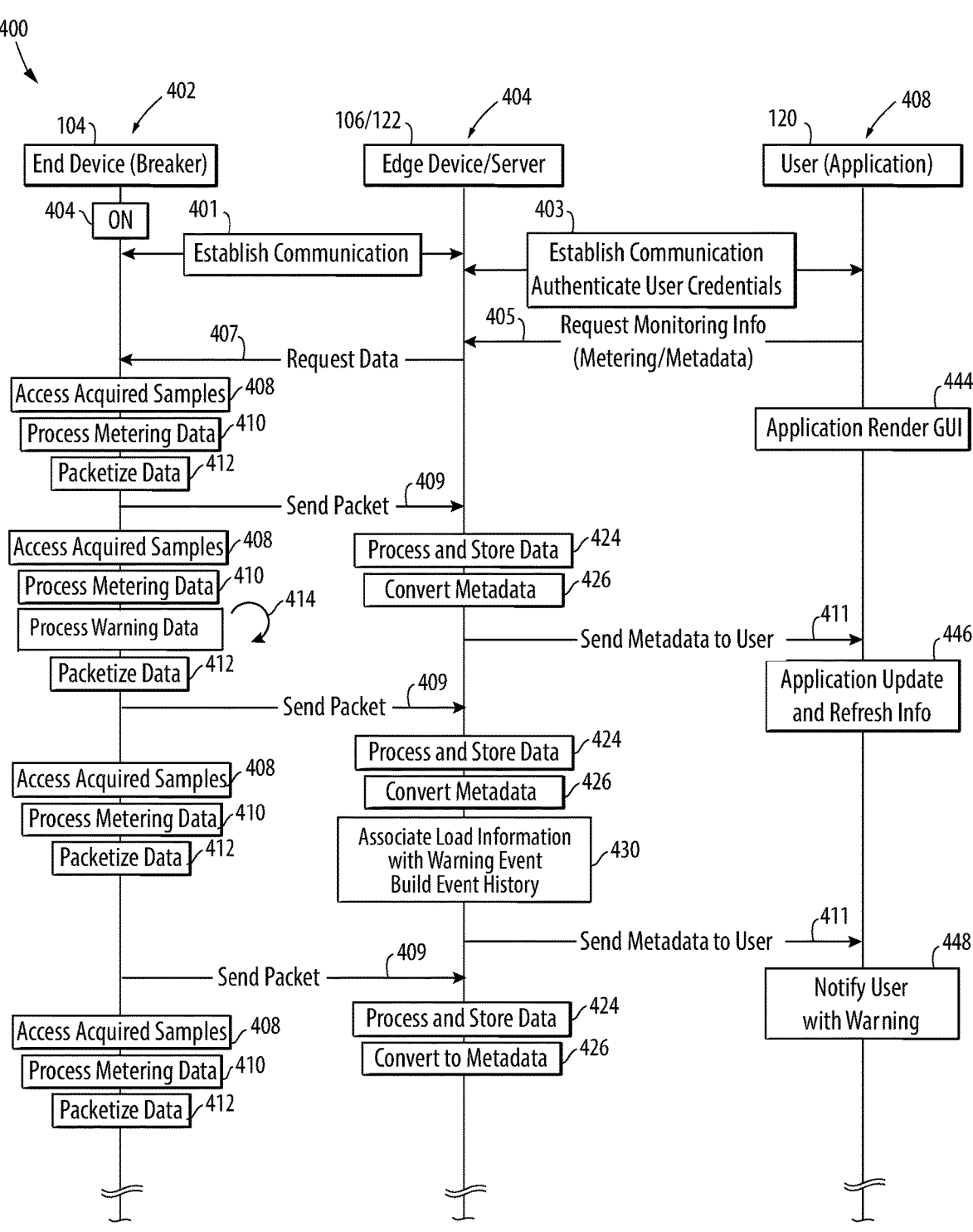
FIG. 4 is a process flowchart of example operation of the circuit management system of FIG. 1, in accordance with embodiments of the disclosure.

With reference to FIG. 4, and continued reference to FIG. 1-3, a process flowchart 400 is shown in accordance with one or more embodiments of an example flow between a circuit breaker 104 of a plurality of circuit breakers in load center 102, edge device 106 and/or server 122, and user device 120. It is understood that any of the processing, storing, converting, and associating tasks shown and described could be performed by another device of the analysis devices 124, such as user device 120 or server 122, with appropriate authentication, authorization and communication.

Operations performed by circuit breaker 104 are shown in column 402, operations performed by edge device 106 are shown in column 404, and operations performed by user application 120 are shown at column 408.

At operation 404, circuit breaker 104 is enabled, such as by installment in load center 102, which can cause AFE circuits of arc fault sensor(s) and AFE 202A and ground fault sensor(s) and AFE 202B of circuit breaker 104 to begin acquiring data. At flow 401 communication is established between edge device 106, e.g., by appropriate handshaking. At flow 403, communication is established between edge device 106 and/or server 122 and user device 108, such as by appropriate handshaking and authentication of user credentials. User device 108 executes a monitoring application that enables user device 108 to communicate with edge device 106 and/or server 122 and perform associated operations. At flow 405 a monitor request is sent from user device 405 to edge device 106, such as to request monitoring data, which can include metering data and/or metadata. The monitor request can be generated based on user input via a user interface (e.g., a graphical user interface (GUI), a textual interface, a switch panel, etc.) or based on a decision by a processing device of user device 108. In one or more embodiments, the monitoring application executed by user device 120 renders the GUI on user device 120.

In response to receiving the monitor request, edge device 106 sends a data request at flow 407 to circuit breaker 104. In response to the data request from edge device, circuit breaker 104 accesses the acquired samples for processing at operation 408, processes metering data at operation 410, and packetizes the processed metering data at 412. The packet(s) are sent to edge device 106 at flow 409. Operations 408, 410, 412 and output of flow 409 can be repeated periodically during normal operation. This would correspond to the state machine 210 remaining in normal state 302, as shown by arrow 309 in FIG. 3.

After edge device 106 receives the packetized metering data, at operation 424 edge device 106 and/or server 122 process the packetized metering data and store the packetized metering data and/or processing results in associated storage. At operation 426 edge device 106 and/or server 122 convert the packetized metering data and/or processing results into metadata. The metadata is output to user device at flow 411. The monitoring application executed by user device 122 updates and refreshes stored and displayed data using the received metadata. The metadata sent at flow 411 can be only associated with this circuit breaker 104 if it was identified in the monitor request and/or associated with loads identified in the monitor request. Operations 424, 426, and flow 411 are repeated after metadata is received at flow 409.

An occurrence of a departure from normal operation is shown at operation 414 in which warning data is processed. This occurred due to detection of a fault by circuit breaker 104, which caused circuit breaker 104 to transition from normal state 302 to fault state 306 and back to normal state 302. In the example state machine 210 shown in FIG. 2, these transitions would occur via warning notification state 304. These transitions also would result in transmission to and from a communication state via which a warning event notification is issued with warning data. After the warning data is processed (with the warning event notification), at operation 412 the warning data and warning event notification are packetized. The metering data can be packetized as well at operation 412. The packet sent at flow 409 includes the packetized warning data and warning event notification.

After edge device 106 receives the packetized metering data with warning data and warning event notification, edge device 106 and/or server 122 perform operations 424 and 426, followed by performance of operation 430. At operation 430, the warning data is processed, such as by disaggregating the warning data by load, associating the disaggregated warning data with a load, comparing to historical data, updating historical data, determining whether there is an impending trip of a particular load, etc. At block 430, a determination can be made whether received warning event notifications have reached a threshold, e.g., based on application of one or more statistical models, resulting in determination of an impending trip. If it is determined that there is an impending trip, an impending trip notification is included with metadata sent to user device at flow 411. In one or more embodiments, the metadata can further include identification of the load that is exhibiting malfunctions and the likely cause of the impending trip, a probability of the predicted impending trip, recent feature data, a record of information output by the one or more models, etc.

Upon receiving metadata by user device 120 with notification of an impending trip, the application executed by user device causes display of a warning to notify the user of the impending trip.

Figure 5A:
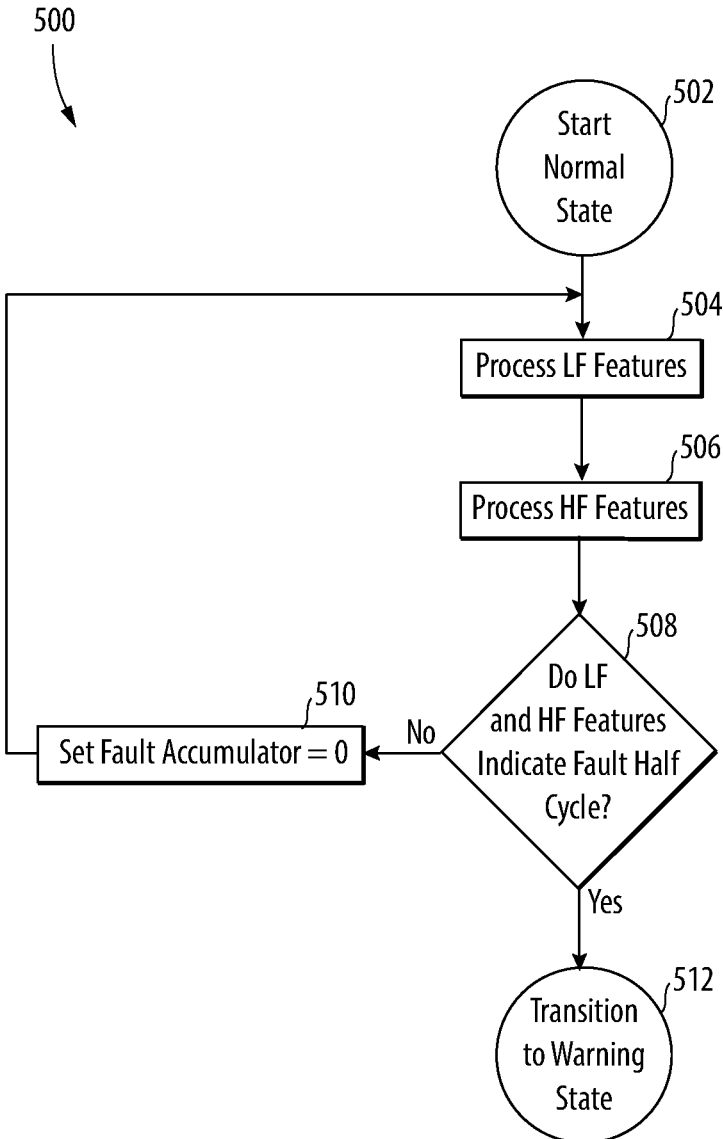
FIGS. 5A-5D show flowcharts of example methods performed in different states of the state machine of FIG. 3, in accordance with embodiments of the disclosure.

With reference to FIGS. 5A-5D, flowcharts are shown of example methods performed in different states of state machine 210. FIG. 5A shows a flowchart 500 of an example method when state machine 210 is in the normal state. The method begins at block 502. At block 504, LF features are processed. At block 506, HF features are processed. At block 508 a determination is made whether the LF and HF features indicate a fault half cycle. If the determination at block 508 is NO, meaning the LF and HF features do not indicate a fault half cycle, the method continues at block 510, at which Fault Accumulator is set to 0. If the determination at block 508 is YES, meaning the LF and HF features do indicate a fault half cycle, the method continues at block 512. At block 512, the state of state machine 210 transitions to the warning notification state.

Figure 5B:
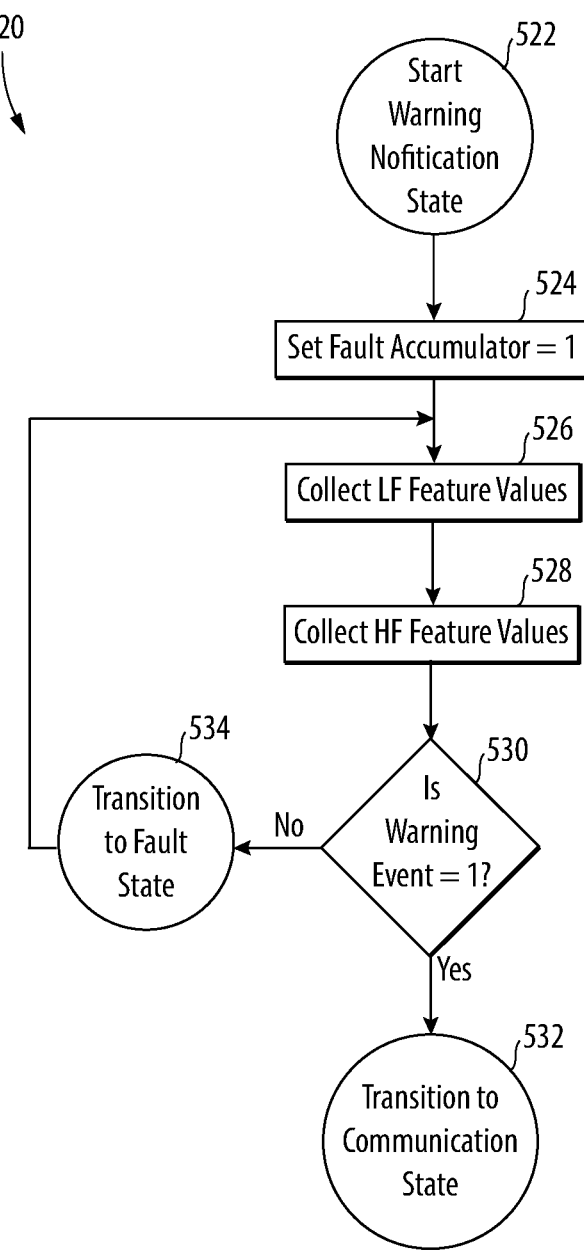

FIG. 5B shows a flowchart 520 of an example method when state machine 210 is in the warning notification state. The method begins at block 522, at which Fault Accumulator is set to 1. At block 524, LF feature values are collected. At block 526, HF features values are collected. At block 530 a determination is made whether Warning Event is equal to one. If the determination at block 528 is YES, meaning Warning Event is equal to one, the method continues at block 532. At block 532, the state of state machine 210 transitions to the communication state. If the determination at block 530 is NO, meaning Warning Event is not equal to one, the method continues at block 534. At block 534, the state of the state machine 210 transitions to the fault state.

Figure 5C:
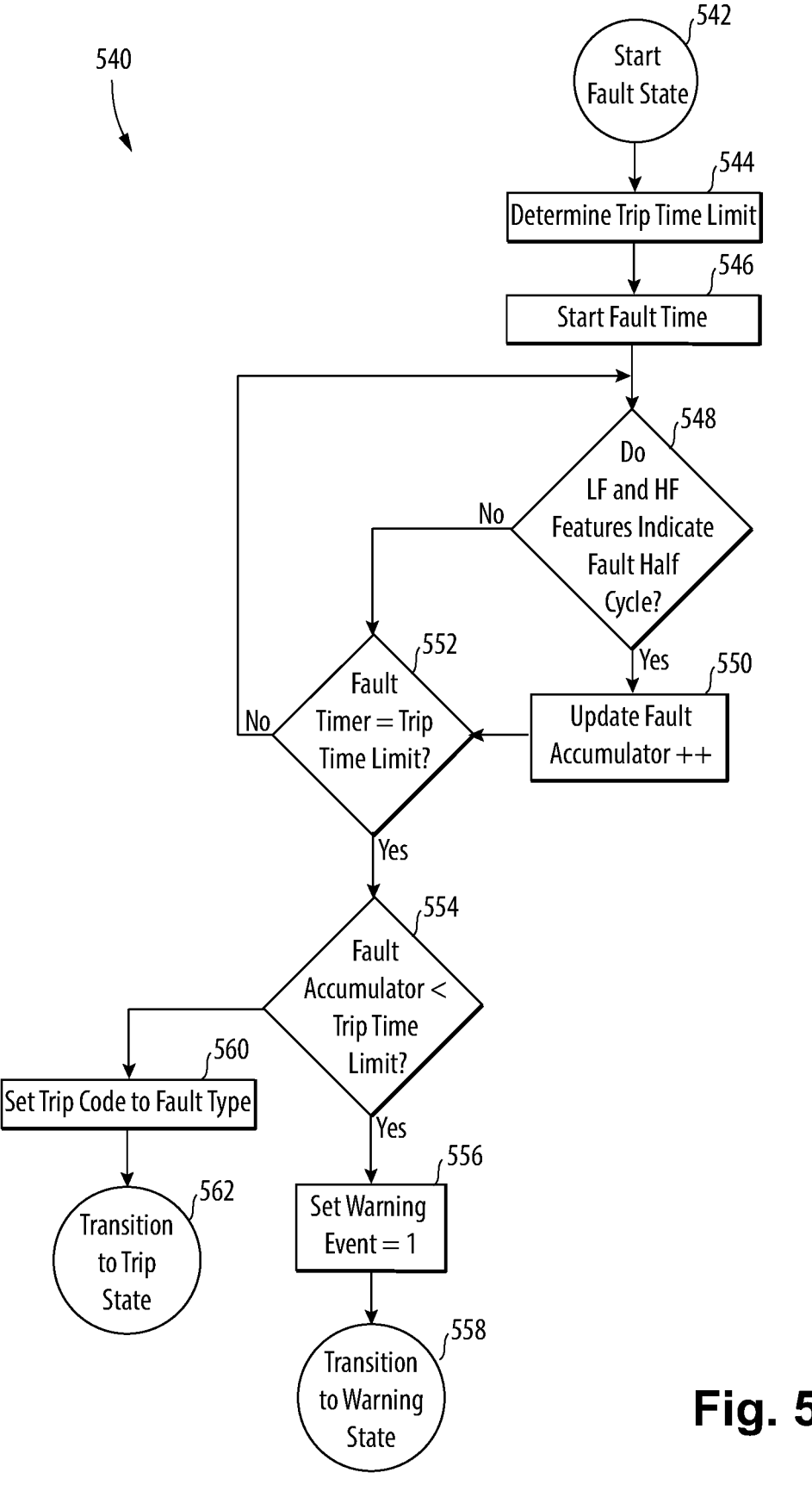

FIG. 5C shows a flowchart 540 of an example simplified method when state machine 210 is in the fault state. While flowchart 540 is not intended to a particular method for determining when to transition to one of the next states, flowchart 540 illustrates that a determination can be made to transition to either the trip state or the warning state.

The method begins at block 542, at which the value of Trip Time Limit is determined. At block 544, the fault timer is started. At block 546, a determination is made whether the LF and HF features indicate a fault half cycle? If the determination at block 544 is YES, meaning the LF and HF features do indicate a fault half cycle, the method continues at block 550, at which Fault Accumulator is incremented, after which the method continues at block 552. If the determination at block 548 is NO, meaning the LF and HF features do not indicate a fault half cycle, the method continues at block 552, bypassing block 550. At block 552, a determination is made whether the fault timer is equal to Trip Time Limit. If the determination at block 552 is NO, meaning the fault timer is not equal to Trip Time Limit, the method continues at block 548, forming a loop. If the determination at block 552 is YES, meaning the fault timer is equal to Trip Time Limit, the method continues at block 554.

At block 554, a determination is made whether Fault Accumulator is less than Trip Time Limit. If the determination at block 554 is YES, meaning Fault Accumulator is less than Trip Time Limit, the method continues at block 556, at which Warning Event is set to equal 1. The method continues at block 558, at which the state of state machine 210 transitions to the warning notification state. If the determination at block 554 is NO, meaning Fault Accumulator is not less than Trip Time Limit, the method continues at block 560, at which Trip Code is set to the fault type. The method continues at block 562, at which the state of the state machine 210 transitions to the trip state.

Figure 5D:
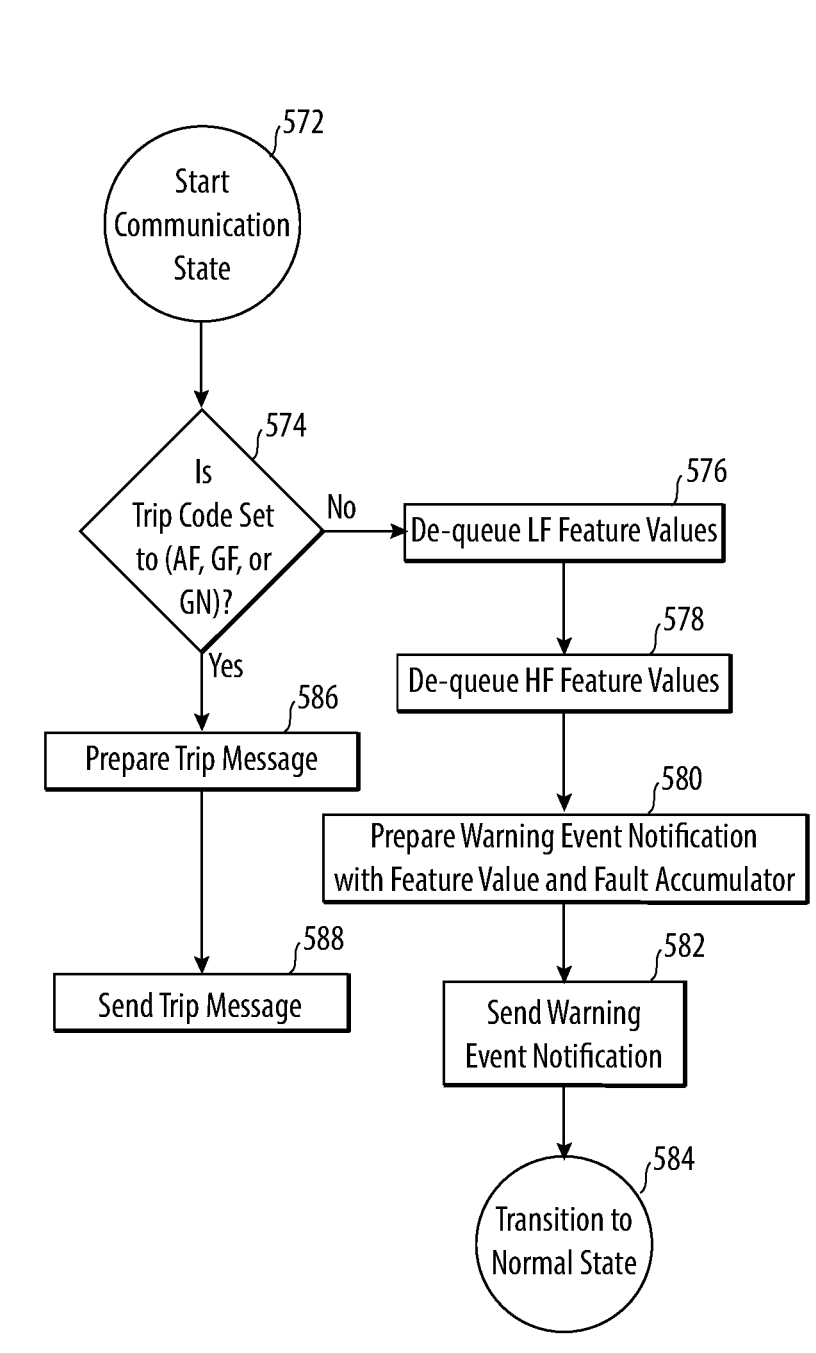

FIG. 5D shows a flowchart 570 of an example method when state machine 210 is in the communication state. The method begins at block 572. At block 574, a determination is made whether Trip Code is set to any of AF (indicating an arc fault), GF (indicating a ground fault), and GN (indicating a grounded neutral fault). If the determination at block 574 is NO, meaning Trip Code is not set to any of AF, GF, or GN, the method continues at block 576. At block 576, the LF features are de-queued (removed from their queue). At block 578, the HF features are de-queued (removed from their queue). At block 580 a warning event notification is prepared, wherein the warning event notification includes the LF and HF feature values and the fault accumulator. At block 582, the warning event notification is output. At block 584, the state of state machine 210 transitions to the normal state.

If the determination at block 574 is YES, meaning Trip Code is set to any of AF, GF, or GN, the method continues at block 576. At block 576, a trip message is prepared. At block 588, the trip message is output.

Figure 6:
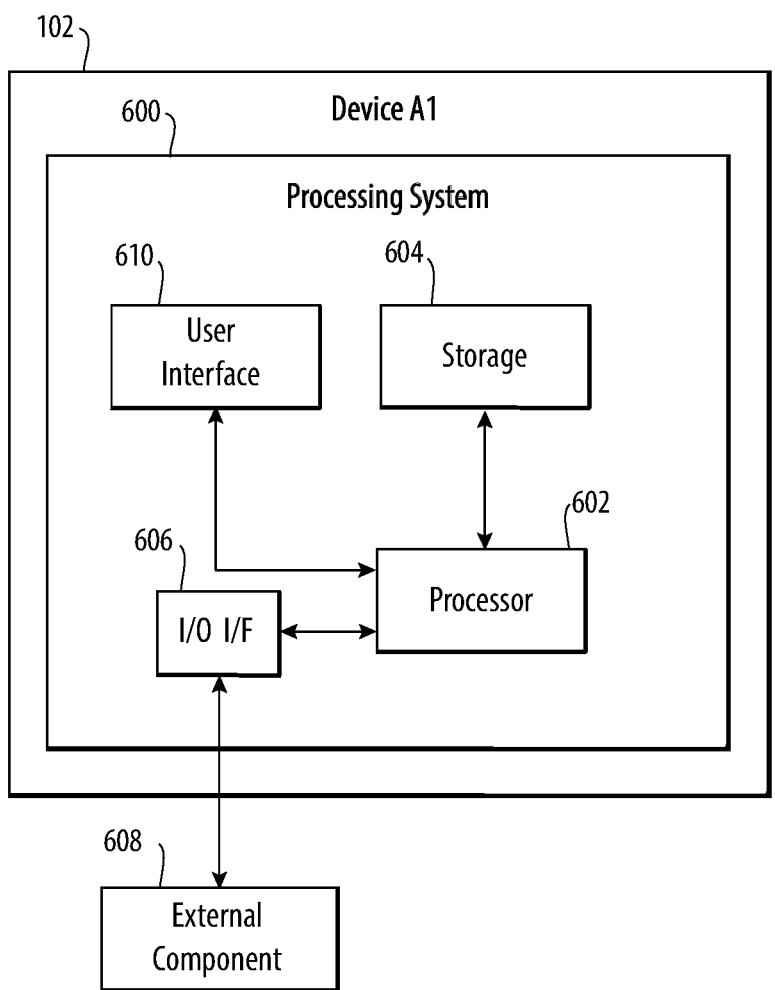
FIG. 6 is a block diagram of an exemplary computer system that implements any of the smart devices shown in FIG. 1, in accordance with embodiments of the disclosure.

With reference to FIG. 6, a block diagram of an example computing system 600 is shown, which provides an example configuration of a device A1 implemented using an example processing system. Device A1 can be any smart element included in circuit management system 100, such as circuit breaker 104, edge device 106, user device 120, and/or server 122. Additionally, portions of device A could be configured as software, and computing system 600 could represent such portions. Computing system 600 is only one example of a suitable system and is not intended to suggest any limitation as to the scope of use or functionality of embodiments of the disclosure described herein. Computing system 600 can be implemented using hardware, software, and/or firmware. Regardless, computing system 600 is capable of being implemented and/or performing functionality as set forth in the disclosure.

Computing system 600 is shown in the form of a general-purpose computing device. Computing system 600 includes a processing device 602, memory 604, an input/output (I/O) interface (I/F) 606 that can communicate with an internal component, such as a user interface 610, and optionally an external component 608. The processing device 602 can include, for example, a programmable logic device (PLD), microprocessor, DSP, a microcontroller, an FPGA, an ASIC, and/or other discrete or integrated logic circuitry having similar processing capabilities.

The processing device 602 and the memory 604 can be included in components provided in the FPGA, ASIC, microcontroller, or microprocessor, for example. Memory 604 can include, for example, volatile and non-volatile memory for storing data temporarily or long term, and for storing programmable instructions executable by the processing device 602. Memory 604 can be a removable (e.g., portable) memory for storage of program instructions. I/O I/F 606 can include an interface and/or conductors to couple to the one or more internal components 610 and/or external components 608.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flow diagram and/or block diagram block or blocks.

The computer program instructions may also be loaded onto a computer, other programmable data processing apparatus, or other devices to cause a series of operational operations to be performed on the computer, other programmable apparatus or other devices to produce a computer implemented process such that the instructions which execute on the computer or other programmable apparatus provide processes for implementing the functions/acts specified in the block diagram block or blocks.

Embodiments of device A1 may be implemented or executed by one or more computer systems, such as a microprocessor. Each computer system 600 can be included within device A1, or multiple instances thereof. In the example shown, computer system is embedded in device A1. In various embodiments, computer system 600 may include one or more of a microprocessor, an FPGA, application specific integrated circuit (ASIC), microcontroller. The computer system 600 can be provided as an embedded device. Portions of the computer system 600 can be provided externally, such by way of a centralized computer.

Computer system 600 is only one example of a suitable system and is not intended to suggest any limitation as to the scope of use or functionality of embodiments of the disclosure described herein. Regardless, computer system 600 is capable of being implemented and/or performing any of the functionality set forth hereinabove.

Computer system 600 may be described in the general context of computer system-executable instructions, such as program modules, being executed by a computer system. Generally, program modules may include routines, programs, objects, components, logic, data structures, and so on that perform particular tasks or implement particular abstract data types.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

I claim:

1. A method of monitoring electrical faults, the method comprising:

processing features of signals output by at least one sensor of a circuit breaker about electrical properties of a circuit coupled with a load;

transitioning between states of operation based on the processed features, wherein the states of operation include a normal state, a warning notification state, a communication state, a fault state, and a trip state, wherein the state of operation remains in the normal state until the processed features no longer satisfy normal criteria;

in response to dissatisfaction of the normal criteria, transitioning to the warning notification state, including commencing of buffering of the processed features of the signals in a queue, followed by transitioning to the fault state and:

in response to a trip condition not being satisfied, transitioning from the fault state to the warning notification state, indicating that a warning event was detected;

in response to the trip condition being satisfied, transitioning from the fault state to the trip state;

in response to the transition back to the warning notification state, transitioning from the warning notification state to the communication state to output a warning event notification and contents of the queue in association with the warning event notification;

detecting the warning event when the state of operation transitions from the normal state to one of the fault state and the warning notification state and back to the normal state; and outputting the warning event notification upon determination of the warning event.

2. The method of claim 1, wherein the electrical faults are arc faults, ground faults, and/or grounding neutral faults.

3. The method of claim 1, wherein the contents of the queue include processed features of the signals that correspond to operation of the circuit breaker from a time it transitions out of normal state until it transitions back to normal state.

4. The method of claim 1, wherein the warning event notifications include a warning duration that indicates a duration of time the circuit breaker did not operate in the normal state, wherein the probability of an impending trip is determined based upon parameters including at least one of a number of warning event notifications, the warning duration, and a time duration between the warning event notifications, and/or changes in one or more of the parameters.

5. The method of claim 1, further comprising:

receiving warning data with the warning event notification, the warning data including any of the processed features that are a function of electrical characteristics of an electrical circuit branch connected between the circuit breaker and one or more loads sensed after the breaker transitioned from the normal state, wherein the electrical characteristics were sensed by the circuit breaker, and wherein the probability of an impending trip is determined based upon changes in the processed features.

6. The method of claim 4, further comprising:

disaggregating the warning data to identify which of the one or more loads were powered on or operating when the corresponding electrical characteristics were sensed, wherein the probability of impending trip is further a function of operation of the one or more loads that were identified.

7. The method of claim 5, further comprising:

applying at least one model for determining when to output the trip impending notification; and applying machine learning, statistical, and/or numerical techniques for training and/or applying the at least one model.

8. The method of claim 1, wherein the trip impending notification is output via wireless communication to a user device and/or via a network to a remote device.

9. A system for monitoring electrical faults, the system comprising:

a circuit breaker comprising:

at least one sensor configured to sense electrical properties of a circuit coupled with a load;

a first memory configured to store a plurality of programmable instructions; and at least one processing device in communication with the first memory, wherein the at least one processing device, upon execution of the plurality of programmable instructions, is configured to:

process features of signals output by the at least one sensor;

transition between states of operation based on the processed features, wherein the states of operation include a normal state, a fault state, and a trip state, wherein the state of operation remains in the normal state until the processed features no longer satisfy normal criteria, after which the state of operation transitions to the fault state, wherein the state of operation transitions from the fault state back to the normal state when a trip condition is not satisfied, and transitions to the trip state when the trip condition is satisfied;

detect a warning event when the state of operation transitions from the normal state to the fault state and back to the normal state; and output one or more warning event notifications upon determination of the warning event; and an edge device comprising:

a second memory configured to store a plurality of programmable instructions; and at least one processing device in communication with the second memory, wherein the at least one processing device, upon execution of the plurality of programmable instructions, is configured to:

receive from the circuit breaker the one or more warning event notifications, wherein each warning event notification is based on detection of a pattern of transitions between the states of operation of the circuit breaker, wherein the pattern includes a series of transitions that includes transitions from the normal state to the fault state and back to the normal state;

determine a probability of an impending trip based on the pattern detected in association with the respective one or more warning notifications; and output a trip impending notification as a function of the determined probability.

10. A method of monitoring electrical faults, the method comprising:

receiving from the circuit breaker recited in claim 9 the one or more warning event notifications;

determining the probability of the impending trip based on the pattern detected in association with the respective one or more warning event notifications; and outputting the trip impending notification as a function of the determined probability.

11. The edge device of claim 9, wherein the states of operation further include a warning notification state that indicates that a warning event was detected, and wherein the warning event notification includes a warning duration that indicates a duration of time the circuit breaker did not operate in the normal state, wherein the probability of an impending trip is determined based upon parameters including at least one of a number of warning event notifications, the warning duration, and a time duration between the warning event notifications, and/or changes in one or more of the parameters.

12. The edge device of claim 9, wherein the at least one processing device, upon execution of the plurality of programmable instructions is further configured to receive warning data with the warning event notification, the warning data including any of the processed features that are a function of electrical characteristics of an electrical circuit branch connected between the circuit breaker and one or more loads sensed after the breaker transitioned from the normal state, wherein the electrical characteristics were sensed by the circuit breaker, and wherein the probability of an impending trip is determined based upon changes in the processed features.

13. The edge device of claim 12, wherein the at least one processing device, upon execution of the plurality of programmable instructions, is further configured to disaggregate the warning data to identify which of the one or more loads were powered on or operating when the corresponding electrical characteristics were sensed, wherein the probability of impending trip is further a function of operation of the one or more loads that were identified.

14. The edge device of claim 13, wherein the at least one processing device, upon execution of the plurality of programmable instructions, is further configured to apply at least one model for determining when to output the trip impending notification and/or apply machine learning, statistical, and/or numerical techniques for training and/or applying the at least one model.

15. The edge device of claim 9, wherein the trip impending notification is output via a wireless communication to a user device and/or via a network to a remote device.

16. The system of claim 9, wherein the states of operation include the normal state, a warning notification state, a communication state, the fault state, and the trip state and the at least one processing device of the circuit breaker is configured to:

in response to dissatisfaction of the normal criteria, transition to the warning notification state followed by a transition to the fault state;

in response to the trip condition not being satisfied, transition from the fault state back to the warning notification state to indicate that the warning event was detected; and in response to the transition back to the warning notification state, transition to the communication state to output the warning event notification.

17. A method of monitoring electrical faults, the method comprising:

processing features of signals output by at least one sensor of a circuit breaker about electrical properties of a circuit coupled with a load;

transitioning between states of operation based on the processed features, wherein the states of operation include a normal state, a fault state, and a trip state, wherein the state of operation remains in the normal state until the processed features no longer satisfy normal criteria, after which the state of operation transitions to the fault state, wherein the state of operation transitions from the fault state back to the normal state when a trip condition is not satisfied, and transitions to the trip state when the trip condition is satisfied;

detecting a warning event based on detection of a pattern of transitions between the states of operation, wherein the pattern includes a series of transitions that includes transitions from the normal state to the fault state and back to the normal state;

outputting a communication packet with a warning event notification each time the warning event is detected;

receiving communication packets including one or more warning event notifications that were output;

determining a probability of an impending trip based on the pattern detected in association with the respective one or more warning event notifications; and outputting a trip impending notification as a function of the determined probability.

18. The method of claim 17, wherein the processed features are a function of electrical characteristics of an electrical circuit branch connected to one or more loads that were sensed after the transition from the normal state, and wherein the probability of an impending trip is further determined based upon changes in the processed features.

*     *     *     *     *